United States Patent
Lee

(10) Patent No.: US 6,225,838 B1
(45) Date of Patent: May 1, 2001

(54) INTEGRATED CIRCUIT BUFFERS HAVING REDUCED POWER CONSUMPTION REQUIREMENTS

(75) Inventor: Jae-Yup Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/395,650

(22) Filed: Sep. 14, 1999

(30) Foreign Application Priority Data

Sep. 21, 1998 (KR) ................................................. 98-39099

(51) Int. Cl.⁷ ................................................. H03B 1/00
(52) U.S. Cl. ........................................... 327/108; 327/112
(58) Field of Search ................................. 326/21, 22, 23, 326/24, 25, 26, 27, 29, 70, 71, 81, 82, 83; 327/108, 112, 379, 384, 391, 541, 544

(56) References Cited

U.S. PATENT DOCUMENTS

| | | | |
|---|---|---|---|
| 4,475,050 | * 10/1984 | Noufer | 327/541 |
| 4,532,439 | * 7/1985 | Koike | 326/26 |
| 4,800,303 | * 1/1989 | Graham et al. | 326/72 |
| 5,087,841 | 2/1992 | Rogers | 326/65 |
| 5,216,299 | 6/1993 | Wanlass | 326/71 |
| 5,268,599 | * 12/1993 | Matsui | 326/71 |
| 5,300,835 | 4/1994 | Assar et al. | 326/68 |
| 5,304,867 | * 4/1994 | Morris | 326/71 |
| 5,467,044 | 11/1995 | Ashe et al. | 327/333 |
| 5,495,185 | * 2/1996 | Goto | 326/81 |
| 5,543,733 | 8/1996 | Mattos | 326/81 |
| 5,654,664 | 8/1997 | Park et al. | 327/531 |
| 5,736,869 | 4/1998 | Wei | 326/81 |
| 5,786,720 | 7/1998 | Nguyen et al. | 327/321 |
| 5,844,425 | 12/1998 | Nguyen et al. | 326/58 |
| 5,986,443 | * 11/1999 | Jeong | 327/391 |
| 6,091,265 | * 7/2000 | Singh | 326/83 |

* cited by examiner

Primary Examiner—Kenneth B. Wells
Assistant Examiner—Paul Dinh
(74) Attorney, Agent, or Firm—Myers Bigel Sibley & Sajovec

(57) ABSTRACT

Integrated circuit buffers include an inverter and a circuit that selectively powers the inverter at a first potential (e.g., $V_{DDL}-\alpha$) when the output of the inverter is at a first logic level (e.g., logic 0) and at a second higher potential (e.g., $V_{DDL}$) when the output of the inverter is at a second logic level (e.g., logic 1) opposite the first logic level. The integrated circuit buffer may include an inverter configured as a PMOS pull-up transistor having a gate electrode electrically coupled to an input node (IN) and a drain electrode electrically coupled to an output node (OUT), and an NMOS pull-down transistor having a gate electrode electrically coupled to the input node and a drain electrode electrically coupled to the output node. A diode and switch are also provided to perform the selective powering operation. The diode is provided to reduce the magnitude of the power supply signal the inverter receives when the PMOS pull-up transistor is inactive (thereby reducing the leakage current through the PMOS pull-up transistor) and the switch is provided to bypass the diode when PMOS pull-up transistor is active.

14 Claims, 3 Drawing Sheets

INTEGRATED CIRCUIT BUFFERS HAVING REDUCED POWER CONSUMPTION REQUIREMENTS

RELATED APPLICATION

This application is related to Korean Application No. 98-39099, filed Sep. 21, 1999, the disclosure of which is hereby incorporated herein by reference.

1. Field of the Invention

The present invention relates to integrated circuit devices, and more particularly to integrated circuit buffers.

2. Background of the Invention

Systems embodying integrated circuit devices frequently include a plurality of large scale integration (LSI) devices that operate at different power supply voltages. Because such devices are frequently electrically interconnected, input buffers are frequently provided within these devices to perform level-shifting operations. For example, input buffers may be provided within these devices to convert signals generated by LSI devices operating at TTL power supply voltages (e.g., 5 volts) into signals that are compatible with LSI devices operating at CMOS power supply voltages (e.g., 3.3 volts). A block diagram of a conventional integrated circuit device having LSI devices therein that operate at different supply voltages is illustrated by FIG. 1. In particular, FIG. 1 illustrates a first LSI device 10 that operates at a power supply voltage level of 5 volts and a second LSI device 12 that operates at a power supply voltage level of 3.3 volts and receives data from the first LSI device 10. U.S. Pat. Nos. 5,654,664 to Park et al. and 5,543,733 to Mattos et al. also disclose conventional buffer circuits.

Referring now to FIG. 2, a conventional input buffer circuit 18 will be described. As illustrated, the buffer circuit 18 receives input data at an input pad 14 and generates output data to an output pad 16. An input pass transistor MN1 (e.g., NMOS transistor) is electrically connected in series (source-to-drain) between the input pad 14 and an input node 15 of an inverter comprising a PMOS pull-up transistor MP1 and an NMOS pull-down transistor MN2. A CMOS power supply voltage $V_{DDL}$ of 3.3 volts, for example, may be provided to the gate electrode of the input pass transistor MN1. As will be understood by those skilled in the art, the magnitude of the largest logic 1 signal at the input node 15 will be equal to $V_{DDL}-Vth_{MN1}$, where $Vth_{MN1}$ is the threshold voltage of the input pass transistor MN1. Accordingly, the input buffer circuit 18 can be used to level shift TTL level signals (e.g., 5 volts) to CMOS level signals (e.g., 3.3 volts). Unfortunately, as illustrated by the downward arrow, leakage current will flow from the power supply signal line $V_{DDL}$ to the ground reference signal line $V_{ss}$ when a logic 1 level signal is present at the input node 15. This leakage current will increase the static power consumption requirements of the buffer circuit. The magnitude of this leakage current is generally a direct function of the magnitude of the negative gate-to-source voltage across the PMOS pull-up transistor MP1. In particular, because the gate-to-source voltage across the PMOS pull-up transistor MP1 may have a negative value of $-Vth_{MN1}$ when a logic 1 signal is present at the input node 15, the PMOS pull-up transistor MP1 may be turned on slightly whenever the output pad 16 is being pulled down to a logic 0 level by the NMOS pull-down transistor MN2.

Referring now to FIG. 3, another conventional input buffer circuit 24 will be described. The buffer circuit 24 receives input data at an input pad 20 and generates output data to an output pad 22. An input pass transistor MN3 (e.g., NMOS transistor) is electrically connected in series (source-to-drain) between the input pad 20 and an input node of an inverter comprising a PMOS pull-up transistor MP2 and an NMOS pull-down transistor MN4. To reduce static leakage currents when the NMOS pull-down transistor MN4 is turned on to pull down the output pad 22 to a logic 0 level, the input node is pulled up to $V_{DDL}$ by the PMOS pull-up transistor MP3. This operates to reduce the magnitude of the negative gate-to-source voltage across the PMOS pull-up transistor MP2 and thereby reduce static leakage currents. Unfortunately, when the input pad 20 is being driven from a logic 0 level to a logic 1 TTL level that is greater than $V_{DDL}$, some driving current may be transferred to the CMOS power supply signal line $V_{DDL}$, along the current path illustrated by the arrow. If this driving current is present, the fan-out capability of the device (e.g., TTL LSI device 10 in FIG. 1) providing the input signal may be reduced.

Thus, notwithstanding the above-described conventional input buffers, there continues to be a need for input buffers that can perform a TTL-to-CMOS level shifting function and have reduced susceptibility to static leakage currents.

SUMMARY OF THE INVENTION

It is therefore an object of the present invention to provide improved integrated circuit buffers.

It is another object of the present invention to provide integrated circuit buffers that can perform TTL-to-CMOS level-shifting operations.

It is still another object of the present invention to provide integrated circuit buffers that can have reduced susceptibility to static leakage currents.

It is yet another object of the present invention to provide integrated circuit buffers that can have symmetric transfer characteristics.

These and other objects, advantages and features of the present invention are provided by integrated circuit buffers that include an inverter and a power supply control circuit that selectively powers the inverter at a first potential (e.g., $V_{DDL}-\alpha$) when the output of the inverter is at a first logic level (e.g., logic 0) and at a second higher potential (e.g., $V_{DDL}$) when the output of the inverter is at a second logic level (e.g., logic 1) opposite the first logic level.

According to one embodiment of the present invention, an integrated circuit buffer is provided that includes an inverter configured as a PMOS pull-up transistor having a gate electrode electrically coupled to an input node and a drain electrode electrically coupled to an output node, and an NMOS pull-down transistor having a gate electrode electrically coupled to the input node and a drain electrode electrically coupled to the output node. A diode and switch are also provided to perform the selective powering operation. The diode is provided to reduce the magnitude of the power supply signal the inverter receives when the PMOS pull-up transistor is inactive (thereby reducing the leakage current through the PMOS pull-up transistor) and the switch is provided to bypass the diode when PMOS pull-up transistor is active. According to a preferred aspect of this embodiment, the diode has a cathode electrically connected to a source electrode of the PMOS pull-up transistor and an anode electrically connected to a power supply signal line (e.g., $V_{DDL}$). During a pull-up operation, the switch can be closed to bypass the diode by electrically connecting the source electrode of the PMOS pull-up transistor directly to the power supply signal line when the output node reaches a first logic potential (e.g., logic 1). Alternatively, the switch is opened when the output node is pulled down to a second logic potential (e.g., logic 0).

In order to provide a symmetric transfer characteristic, a resistor or diode is also preferably connected in series between a source of the NMOS pull-down transistor and a reference signal line (e.g., Vss). A NMOS pass transistor is also preferably provided in series between an input terminal of the buffer and the input node of the inverter. This NMOS pass transistor performs a level-shifting operation so that the buffer, which may be powered at CMOS power supply levels, may reliably receive signals at higher TTL levels, for example.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
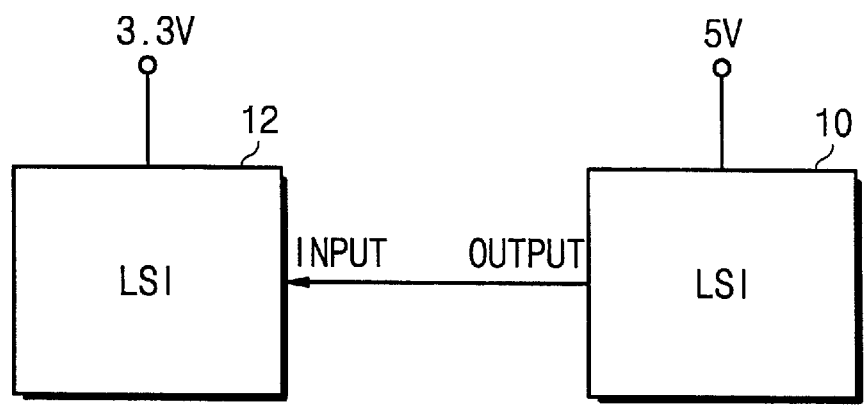
FIG. 1 is a block diagram of a conventional integrated circuit device having LSI devices therein that operate at different supply voltage levels.
Figure 2:
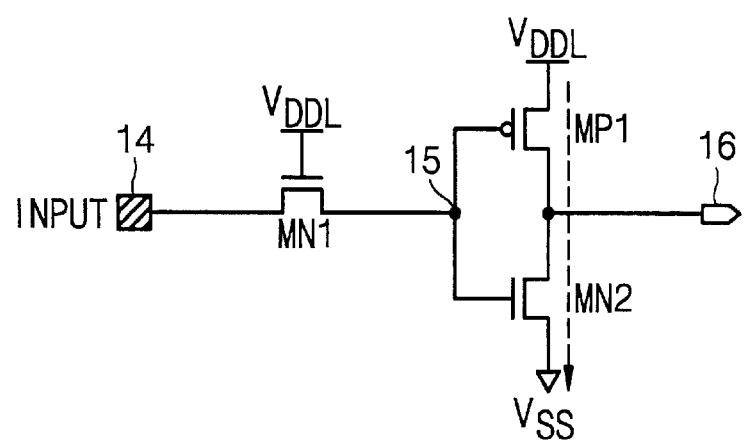
FIG. 2 is an electrical schematic of a conventional input buffer.
Figure 3:
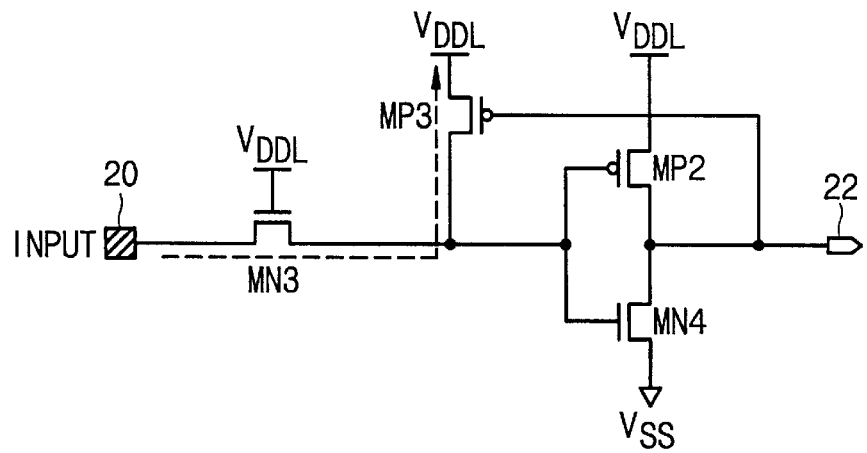
FIG. 3 is another electrical schematic of a conventional input buffer.
Figure 4:
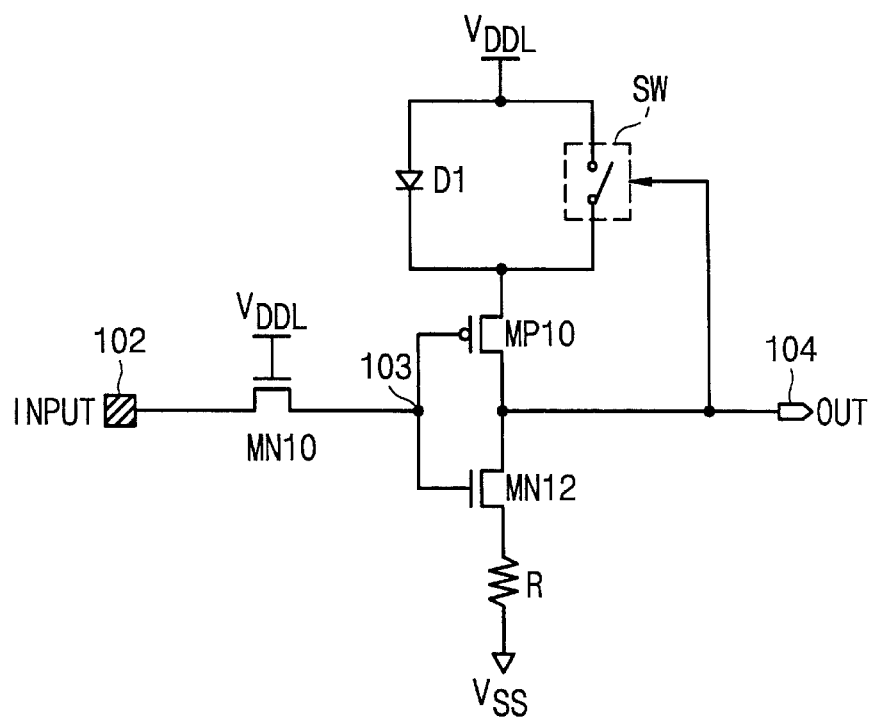
FIG. 4 is an electrical schematic of an input buffer according to a first embodiment of the present invention.

Referring now to FIG. 4, a preferred integrated circuit buffer 100 according to a first embodiment of the present invention will be described. As illustrated, the buffer 100 includes an inverter stage comprising a PMOS pull-up transistor MP10 and an NMOS pull-down transistor MN12. The drains of the PMOS pull-up transistor MP10 and NMOS pull-down transistor MN12 are electrically connected together and to an output node and output terminal 104. The gate electrodes of the PMOS pull-up transistor MP10 and NMOS pull-down transistor MN12 are also electrically connected together at an input node 103. Other inverter circuits may also be used. An input pass transistor MN10 is also provided to perform a level shifting operation. As illustrated, the input pass transistor MN10 is electrically connected in series between the input node 103 and an input terminal 102. The gate electrode of the input pass transistor MN10 is electrically connected to a power supply signal line $V_{DDL}$ which may receive a CMOS power supply voltage of 3.3 volts, for example. Accordingly, a logic 1 input signal at a TTL level (e.g., 5 volts) at the input terminal 102 will be passed to the input node 103 as a logic 1 signal having a magnitude of $V_{DDL}-Vth_{MN10}$, where $Vth_{MN10}$ is the threshold voltage of the input pass transistor MN10. As will be understood by those skilled in the art, this logic 1 signal causes the PMOS pull-up transistor MP10 to turn off and the NMOS pull-down transistor MN12 to turn on and thereby pull the output terminal 104 to a logic 0 level.

According to a preferred aspect of the invention, the leakage current through the PMOS pull-up transistor MP10 can be lowered by reducing the magnitude of the positive voltage across the source-to-gate junction of the PMOS pull-up transistor MP10 when a logic 1 input signal is received at the input terminal 103. This reduction in source-to-gate voltage is preferably achieved through use of a diode D1 that is electrically connected in series between the power supply signal line $V_{DDL}$ and the source of the PMOS pull-up transistor MP10. This diode D1 will operate to reduce the voltage at the source of the PMOS pull-up transistor to a level equal to $V_{DDL}-V_{D1}$, where $V_{D1}$ is the turn-on voltage of the diode.

Figure 5:
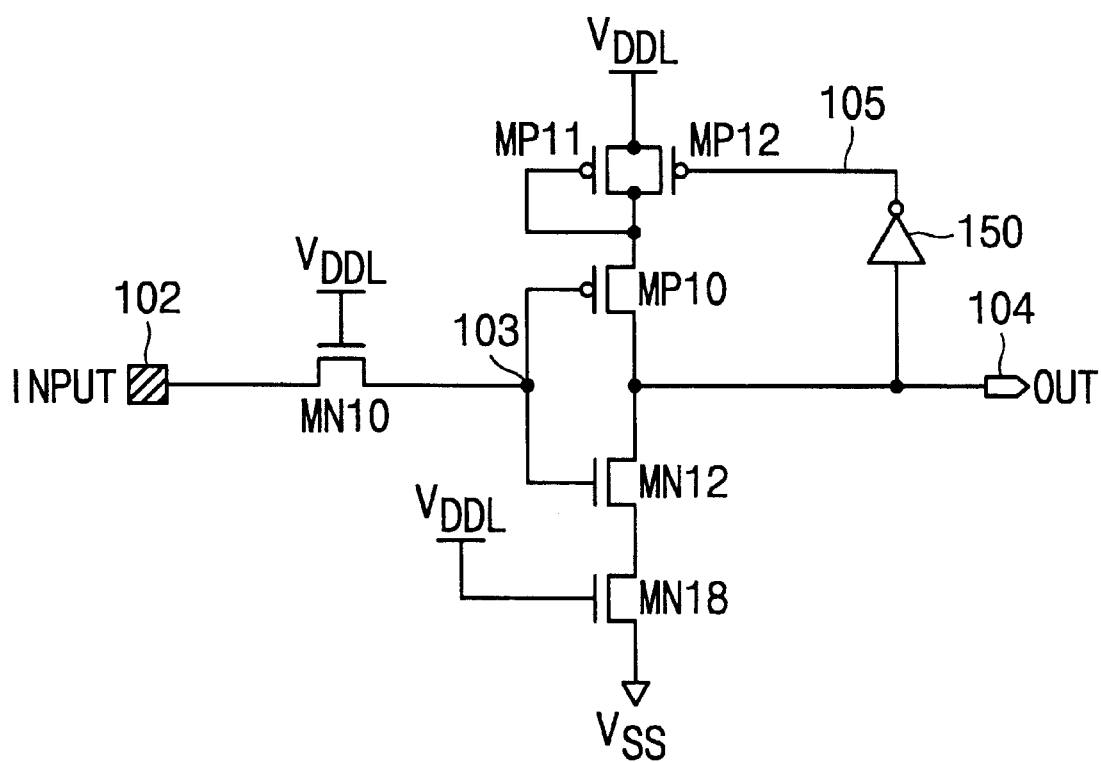
FIG. 5 is an electrical schematic of an input buffer according to a second embodiment of the present invention.

In addition, a switch SW is preferably provided so that the voltage drop associated with the diode D1 is not present when the PMOS pull-up transistor is turned on in response to a logic 0 input signal at the input node 103. In particular, the switch SW becomes closed once a logic 1 signal is established at the output node of the inverter. Here, the turn on of the switch SW enables the PMOS pull-up transistor MP10 to pull the output node to a full logic 1 level equal to $V_{DDL}$. This switch SW may comprise a PMOS transistor having a source electrode electrically connected to the source electrode of the PMOS pull-up transistor MP10 and a drain electrode electrically connected to the power supply signal line $V_{DDL}$. As illustrated by FIG. 5, an inverter 150 may also be provided in series between the output terminal 104 and the gate electrode of the PMOS transistor acting as a switch. Moreover, because the presence of the diode D1 in the pull-up path will operate to offset or distort the symmetry of the DC transfer characteristics of the inverter, a resistor R is preferably provided in the pull-down path (i.e., between a source of the NMOS pull-down transistor MN12 and a reference signal line Vss). The value of the resistor R is preferably set at a level equal to the on-state resistance of the diode D1.

Referring now to FIG. 5, another embodiment of an integrated circuit buffer 200 according to the present invention is illustrated. This buffer 200 is similar to the buffer 100 of FIG. 4, however, the diode D1 in FIG. 4 has been replaced by a PMOS transistor MP11 and the switch SW in FIG. 4 has been provided as a PMOS transistor MP12. In addition the resistor R in FIG. 4 has been replaced by an NMOS transistor MN18 which is connected to operate as a resistor. Accordingly, the diode D1 and switch SW of FIG. 4 or the PMOS transistors MP11 and MP12 of FIG. 5 operate as a power supply control circuit that selectively powers the source electrode of said PMOS pull-up transistor MP10 at a first potential (e.g., $V_{DDL}-\alpha$) when the output node is at a logic 0 potential and at a second potential (e.g., $V_{DDL}$) when the output node is at a logic 1 potential. Here, "α" may represent the turn-on voltage of the diode D1 or PMOS transistor MN11.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit buffer, comprising:
   a PMOS pull-up transistor having a gate electrode electrically coupled to an input node and a drain electrode electrically coupled to an output node;
   an NMOS pull-down transistor having a gate electrode electrically coupled to the input node and a drain electrode electrically coupled to the output node;
   a diode having a cathode electrically connected to a source electrode of said PMOS pull-up transistor and an anode electrically connected to a power supply signal line; and
   a switch that is closed to bypass said diode by electrically connecting the source electrode of said PMOS pull-up transistor to the power supply signal line when the output node is at a first logic potential and open when the output node is at a second logic potential opposite the first logic potential.

2. The integrated circuit buffer of claim 1, wherein said switch comprises a field effect transistor having a gate electrode electrically connected to the output node.

3. The integrated circuit buffer of claim 2, wherein said switch comprises an NMOS transistor having a gate electrode electrically connected to the output node, a source electrode electrically connected to the source electrode of said PMOS pull-up transistor, and a drain electrode electrically connected to the power supply signal line.

4. The integrated circuit buffer of claim 1, wherein said diode is selected from the group consisting of junction diodes and field effect transistors.

5. The integrated circuit buffer of claim 1, further comprising a resistor electrically connected in series between a source of said NMOS pull-down transistor and a reference signal line.

6. The integrated circuit buffer of claim 1, further comprising a second diode having an anode electrically connected to a source of said NMOS pull-down transistor and a cathode electrically connected to a reference signal line.

7. The integrated circuit buffer of claim 1, further comprising:
    an input terminal; and
    a pass transistor electrically connected in series between said input terminal and the input node.

8. The integrated circuit buffer of claim 7, wherein said pass transistor comprises an NMOS transistor having a gate electrode electrically connected to the power supply signal line.

9. An integrated circuit buffer, comprising:
    a PMOS pull-up transistor having a gate electrode electrically coupled to an input node and a drain electrode electrically coupled to an output node;
    an NMOS pull-down transistor having a gate electrode electrically coupled to the input node and a drain electrode electrically coupled to the output node;
    a diode having a cathode electrically connected to the source electrode of said PMOS pull-up transistor and an anode electrically connected to a power supply signal line;
    a PMOS switch transistor having a source electrode electrically connected to the cathode of said diode and a drain electrode electrically connected to the anode of said diode; and
    an inverter having an input electrically connected to the output node and an output electrically connected to a gate electrode of said PMOS switch transistor.

10. The integrated circuit buffer of claim 9, wherein said diode is selected from the group consisting of junction diodes and field effect transistors.

11. The integrated circuit buffer of claim 10 further comprising a resistor electrically connected in series between a source of said NMOS pull-down transistor and a reference signal line.

12. The integrated circuit buffer of claim 10 further comprising a second diode having an anode electrically connected to a source of said NMOS pull-down transistor and a cathode electrically connected to a reference signal line.

13. The, integrated circuit buffer of claim 9, further comprising:
    an input terminal; and
    a pass transistor electrically connected in series between said input terminal and the input node.

14. The integrated circuit buffer of claim 13, wherein said pass transistor comprises an NMOS transistor having a gate electrode electrically connected to the power supply signal line.

* * * * *